(12) United States Patent
Murakami (10) Patent No.: US 10,700,730 B2
(45) Date of Patent: Jun. 30, 2020

(54) SEMICONDUCTOR DEVICE, ELECTRONIC DEVICE, DATA TRANSMISSION METHOD, TIMING CONTROLLER, AND VEHICLE

(71) Applicant: ROHM CO., LTD., Kyoto (JP)

(72) Inventor: Norikazu Murakami, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/219,013

(22) Filed: Dec. 13, 2018

(65) Prior Publication Data

US 2019/0190561 A1    Jun. 20, 2019

(30) Foreign Application Priority Data

Dec. 14, 2017   (JP) ................... 2017-239772

(51) Int. Cl.
*H04B 1/40*     (2015.01)
*G11C 7/10*     (2006.01)

(52) U.S. Cl.
CPC .............. *H04B 1/40* (2013.01); *G11C 7/103* (2013.01); *G11C 7/1018* (2013.01); *G11C 7/1069* (2013.01); *G11C 7/1096* (2013.01)

(58) Field of Classification Search
CPC ........ H04B 1/40; G11C 7/103; G11C 7/1069; G11C 7/1096
See application file for complete search history.

(56) References Cited

U.S. PATENT DOCUMENTS

| | | | |
|---|---|---|---|
| 2010/0149172 A1* | 6/2010 | Tokumasu | G06F 1/10 345/214 |
| 2014/0005808 A1* | 1/2014 | Nishiyama | G05B 19/05 700/86 |
| 2014/0047306 A1* | 2/2014 | Perego | G06F 11/10 714/799 |
| 2014/0244910 A1* | 8/2014 | Tanaka | H04B 10/40 711/103 |

* cited by examiner

*Primary Examiner* — Syed Haider
(74) *Attorney, Agent, or Firm* — Cantor Colburn LLP (57) ABSTRACT

A semiconductor device, includes: a data input pin; a data output pin; an internal circuit; a register accessible by the internal circuit; and a transceiver circuit including a transfer buffer and configured to: write data input through the data input pin to the transfer buffer, and output the data through the data output pin; and transfer data stored in the transfer buffer to the register when a transfer command is input through the data input pin.

6 Claims, 6 Drawing Sheets

SEMICONDUCTOR DEVICE, ELECTRONIC DEVICE, DATA TRANSMISSION METHOD, TIMING CONTROLLER, AND VEHICLE

CROSS-REFERENCE TO RELATED APPLICATION

The present application claims priority under 35 U.S.C. § 119 to Japanese Patent Application No. 2017-239772, filed on Dec. 14, 2017, the entire contents of which are incorporated herein by reference.

TECHNICAL FIELD

The present disclosure relates to data transmission between different semiconductor devices.

BACKGROUND

In order to perform data transmission between different semiconductor devices, an I²C interface, a serial peripheral interface (SPI), or the like is used.

Figure 1:
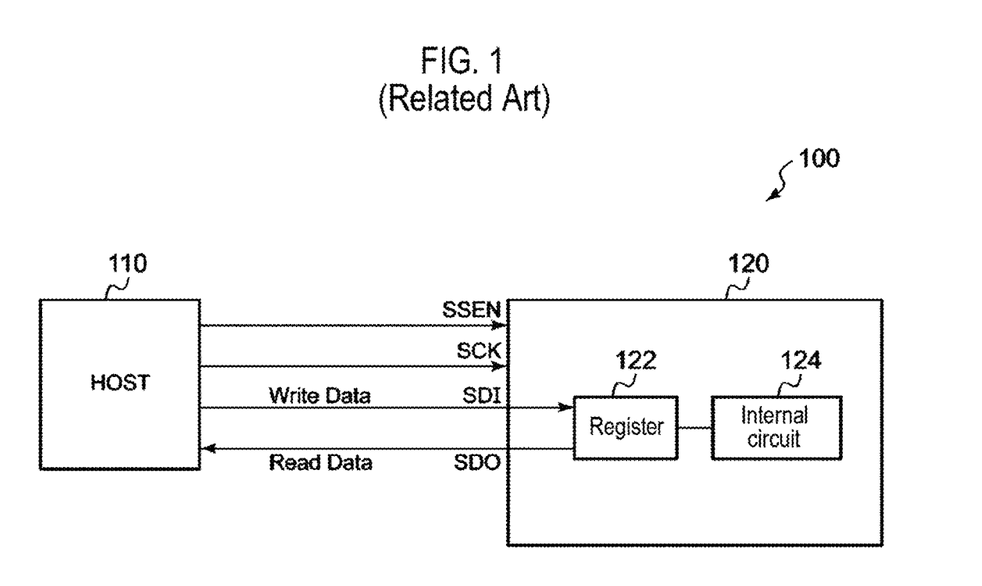
FIG. 1 is a diagram illustrating a transmission system using an SPI.

FIG. 1 is a diagram illustrating a transmission system using an SPI. A transmission system 100 includes a master device 110 and a slave device 120.

The slave device 120 includes a register 122 and an internal circuit 124. The register 122 is connected to be accessible from the internal circuit 124, and operates by referring to data stored in the internal circuit 124 or writes data or a flag obtained as a result of processing in the register 122.

The master device 110 and the slave device 120 are connected via a 4-wire interface, i.e., a slave selection enable (SSEN) line, a serial clock (SCK) line, a serial data input (SDI) line, and a serial data output (SDO) line. The master device 110 can write data to an address specified by the register 122 or can read data from an address specified by the register 122.

If the data is erroneous due to noise or the like during the writing of the data from the master device 110 to the register 122, the internal circuit 124 malfunctions due to the erroneous data. Therefore, in order to improve the reliability, a method called readback is used. Specifically, a series of processing is performed as follows:

(i) Write data to an address in a register
(ii) Read data from the same address in the register
(iii) Determine whether or not the write data matches the read data
(iv) When an error is detected, rewrite the same data.

Figure 2A:
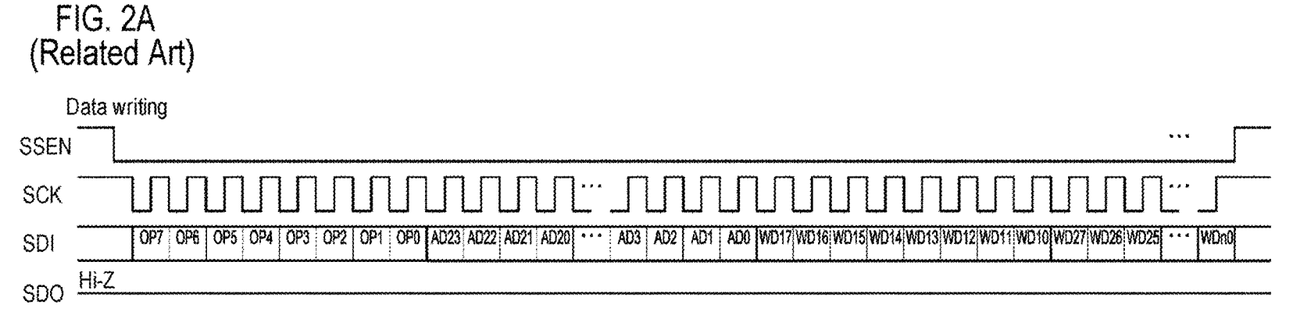
FIG. 2A and FIG. 2B are timing charts of data writing and data reading.
Figure 2B:
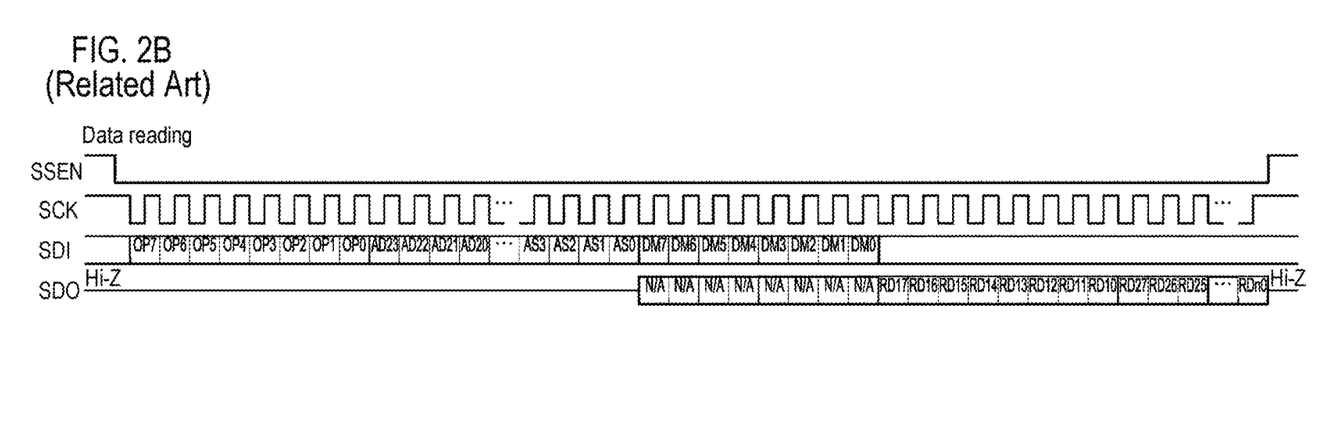

FIG. 2A and FIG. 2B are timing charts of data writing and data reading.

Referring to FIG. 2A, in the data writing, the master device 110 selects one slave device 120 by setting the SSEN line to a predetermined level (here, low). Then, the master device 110 supplies a command (OP7: OP0) indicating a write operation, an access destination address (AD23: AD0), and write data of subsequent n words (where n is a natural number) (WD17: 10, WD27: 20, . . . , WDn7: n0), from the serial data input (SDI), in synchronization with a serial clock SCK.

Referring to FIG. 2B, in the data reading, the master device 110 outputs a command indicating a read operation, an access destination address AD, and dummy data together with the serial clock SCK. Then, data RD at a specified address is output from the serial data output (SDO).

As a result of reviewing the conventional data readback, it has been recognized the following problems. In the readback of the conventional interface, the read sequence illustrated in FIG. 2B occurs after the write sequence illustrated in FIG. 2A is completed. Therefore, there was a problem that a long time is required for determination by the readback. This problem is more pronounced in burst write in which a plurality of words are continuously written.

In addition, the internal circuit 124 may refer to the data written in the register 122 without waiting for verification on the host side. Therefore, if the data is erroneous after completion of the data writing, the internal circuit 124 malfunctions due to the erroneous data.

SUMMARY

The present disclosure provides some embodiments of a semiconductor device with reduced readback time and/or improved reliability.

According to one embodiment of the present disclosure, there is provided a semiconductor device (slave device), including: a data input pin; a data output pin; an internal circuit; a register accessible by the internal circuit; and a transceiver circuit including a transfer buffer and configured to: write data input through the data input pin to the transfer buffer, and output the data through the data output pin; and transfer data stored in the transfer buffer to the register when a transfer command is input through the data input pin.

According to the present embodiment, the master device can receive readback of the data being written before writing of all the data to the slave device is completed. Thus, it is possible to determine whether or not the data match during writing, and thus shorten the time required for readback. In addition, since the data in the register is updated only when the transfer command is issued based on the match determination, it is guaranteed that the data in the register is correct. Thus, it is possible to prevent malfunction of the internal circuit and enhance reliability.

The transceiver circuit is configured to write at least write data and an address to the transfer buffer and to output the at least write data and the address through the data output pin. This makes it possible to further enhance the reliability.

The transceiver circuit is configured to directly write the data input through the data input pin to the register in a direct mode. Therefore, this semiconductor device can be used for platforms that may use the conventional readback method. Thus, it is possible to improve versatility.

According to another embodiment of the present disclosure, there is provided a semiconductor device (master device) for writing data to a slave device, including: a data output pin connected to a data input pin of the slave device; a data input pin connected to a data output pin of the slave device; and a transceiver circuit configured to: output a write command, and an address and first write data following the write command through the data output pin while receiving second write data output from the slave device through the data input pin; and output a transfer command through the data output pin when the second write data matches the first write data.

According to the present embodiment, the semiconductor device as a host can receive readback of the data being written before writing to a transfer buffer is completed. Thus, it is possible to determine whether or not the data match during writing, and thus shorten the time required for readback. In addition, since the data in the register is updated only when the transfer command is issued based on the match determination, it is guaranteed that the data in the register is correct. Thus, it is possible to prevent the malfunction of the slave device and enhance the reliability.

The transceiver circuit includes: a first memory configured to store the first write data; a second memory configured to store the second write data; and a determination circuit configured to determine whether or not the first write data matches the second write data corresponding to the first write data.

According to still another embodiment of the present disclosure, there is provided an electronic device, including: the master device; and the slave device.

According to yet another embodiment of the present disclosure, there is provided a timing controller, including: a main interface configured to receive image data; an image processing part configured to process the image data; a transmitter configured to output the processed image data; and an on-screen display (OSD) circuit configured to superimpose a character on the image data based on control data, wherein the OSD circuit includes: a data input pin; a data output pin; a register; an interface circuit including a transfer buffer and configured to: write data input through the data input pin to the transfer buffer, and output the data through the data output pin; and transfer data stored in the transfer buffer to the register when a transfer command is input through the data input pin; and a decoder configured to superimpose the character on the image data based on the data stored in the register.

According to another embodiment of the present disclosure, there is provided a vehicle including the timing controller.

Further, arbitrarily combining the foregoing components or substituting the expressions of the present disclosure with each other among a method, an apparatus, a system, and the like is also effective as an embodiment of the present disclosure.

DETAILED DESCRIPTION

Embodiments of the present disclosure will be now described in detail with reference to the drawings. Like or equivalent components, members, and processes illustrated in each drawing are given like reference numerals and a repeated description thereof will be omitted. Further, the embodiments are presented by way of example only and are not intended to limit the present disclosure, and any feature or combination thereof described in the embodiments may not necessarily be essential to the present disclosure.

In the present disclosure, "a state where a member A is connected to a member B" includes a case where the member A and the member B are physically directly connected or even a case where the member A and the member B are indirectly connected through any other member that does not affect an electrical connection state between the members A and B. Similarly, "a state where a member C is installed between a member A and a member B" includes a case where the member A and the member C or the member B and the member C are indirectly connected through any other member that does not affect an electrical connection state between the member A and the member C or the member B and the member C, in addition to a case where the member A and the member C or the member B and the member C are directly connected.

Figure 3:
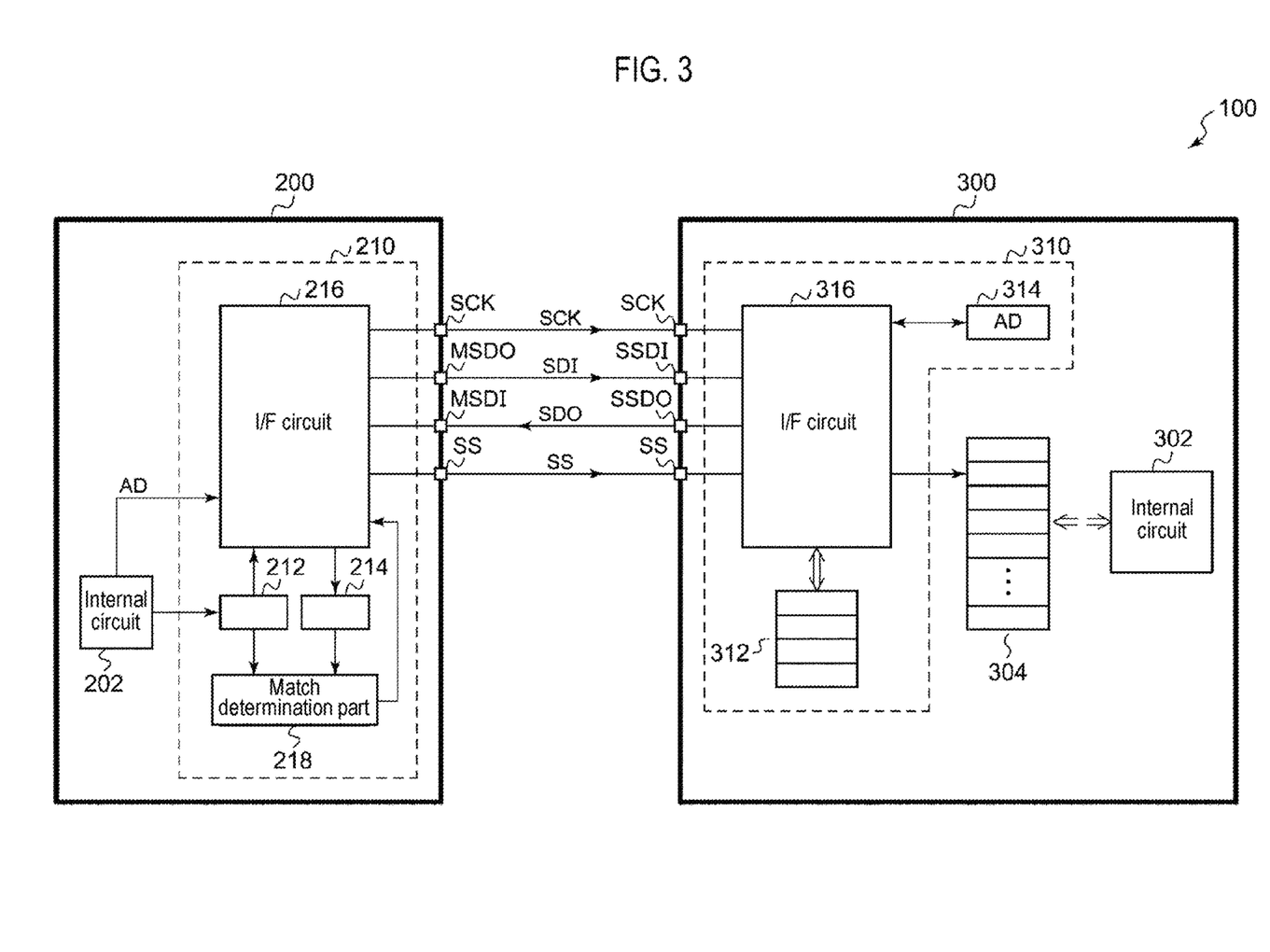
FIG. 3 is a block diagram of a transmission system according to an embodiment of the present disclosure.

FIG. 3 is a block diagram of a transmission system 100 according to an embodiment of the present disclosure. The transmission system 100 includes a master device 200 and a slave device 300. For example, the master device 200 is also referred to as a host device, which is a microcomputer or the like, and the slave device 300 is an integrated circuit (IC) operating under the control of the microcomputer.

The master device 200 and the slave device 300 are connected via a 4-line, i.e., a clock line SCK, data lines SDI and SDO, and slave select enable SSEN. Although only one slave device 300 is illustrated in FIG. 3, a plurality of slave devices 300 may be connected to one master device 200. In this case, an SSEN line is installed for each slave device 300.

An output (MSDO) pin of the master device 200 is connected to an input (SSDI) pin of the slave device 300 via the SDI line. An input (MSDI) pin of the master device 200 is connected to an output (SSDO) pin of the slave device 300 via the SDO line. A clock (SCK) pin of the master device 200 is connected to a clock (SCK) pin of the slave device 300 via the SCK line. A select (SS) pin of the master device 200 is connected to a select (SS) pin of the slave device 300 via an SS line.

The master device 200 includes an internal circuit 202 and a transceiver circuit 210. The slave device 300 includes an internal circuit 302, a register 304, and a transceiver circuit 310.

The transceiver circuit 210 and the transceiver circuit 310 are serial interfaces and are installed to exchange data between the master device 200 and the slave device 300. The data is exchanged through the register 304 installed in the slave device 300. Data writing from the transceiver circuit 310 to the register 304 corresponds to transmission of data from the master device 200 and reception of data by the slave device 300. Reading of data stored in the register 304 by the transceiver circuit 310 corresponds to transmission of data from the slave device 300 and reception of data by the master device 200.

The internal circuit 202 is configured to perform predetermined signal processing, and generates data to be transmitted to the slave device 300 or processes data received from the slave device 300. The transceiver circuits 210 and 310 write the data generated by the internal circuit 202 to an address specified by the register 304. The transceiver circuits 210 and 310 also provide data stored at the address specified by register 304 to the internal circuit 202.

The internal circuit 302 is configured to perform predetermined signal processing, and a portion of the signal processing is based on the data stored in the register 304. In addition, the internal circuit 302 stores data obtained by its internal processing in the register 304.

The overall configuration of the transmission system 100 has been described above. Next, the transceiver circuit 210 and the transceiver circuit 310 will be described.

First, a configuration of the transceiver circuit 310 on the slave device 300 side will be described. The transceiver circuit 310 includes a transfer buffer 312, an address memory 314, and an interface circuit 316.

The transceiver circuit 310 writes data (WD, AD and LG) input through the S SDI pin to the transfer buffer 312 when a first write command is included at the beginning of serial data input through the SSDI pin, and automatically outputs the data WD through the SSDO pin. Preferably, the transceiver circuit 310 also writes, in addition to the write data WD, address data AD accompanying the write data WD and length data LG as described below to the transfer buffer 312, and outputs them through the SSDO pin.

The address AD included in this serial data is also stored in the address memory 314.

When a transfer command is included in the serial data input through the SSDI pin, the data stored in the transfer buffer 312 is transferred to the address AD, which is stored in the address memory 314, of the register 304.

As described above, upon receipt of the first write command from the master device 200, the transceiver circuit 310 sends the received data back to the master device 200 without receiving a read command (automatic readback).

Next, the transceiver circuit 210 will be described.

The transceiver circuit 210 includes a memory 212, a memory 214, an interface circuit 216, and a match determination part 218. The memory 212 temporarily stores data to be transmitted to the slave device 300. The interface circuit 216 converts the write data WD and the address into a serial format and outputs the same through the MSDO pin in synchronization with the serial clock SCK. More specifically, the interface circuit 216 sequentially outputs the first write command OP, the write destination address AD, and the write data WD.

By the automatic readback function described above, the data output through the MSDO pin is returned through the MSDI pin of the master device 200 with a short delay (for example, a delay of one word). The returned data is stored in the memory 214. The match determination part 218 compares the data returned from the slave device 300 and stored in the memory 214 with data (i.e., an expected value) transmitted by the slave device 300 and stored in the memory 212, and determines whether or not they match. If all the transmitted data match, a success flag FLG is set. The interface circuit 216 outputs a transfer command in response to the success flag FLG.

Figure 4:
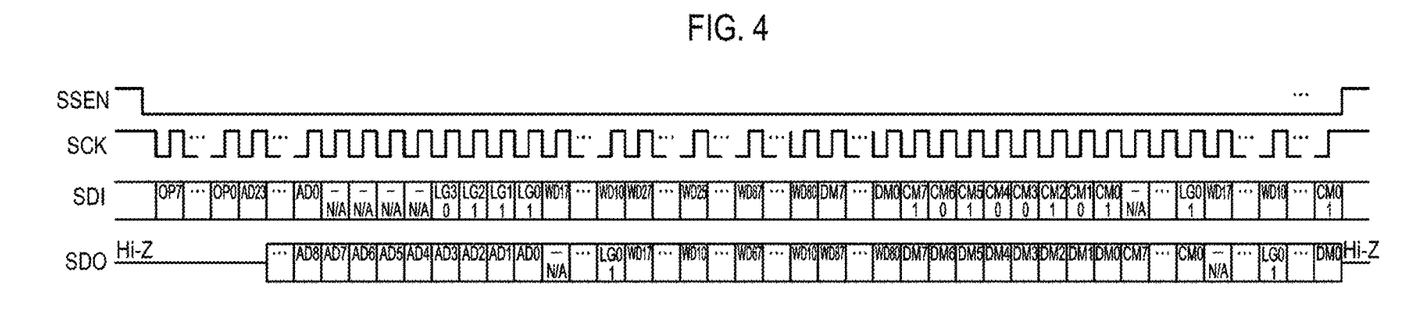
FIG. 4 is a diagram illustrating an operation of the transmission system in FIG. 3.

The configuration of the transmission system 100 has been described above. Next, an operation thereof will be described. FIG. 4 is a diagram illustrating an operation of the transmission system 100 in FIG. 3. In the drawing, reference symbol DM denotes dummy data.

The master device 200 sequentially transmits a first write command (OP7: OP0), an address (AD23: AD0), length data (LG3: LG0), and write data of at least one word (in this example, data of eight words WD17: WD10, WD27: WD20, . . . , WD87: WD80) to the SDI line. The length data LG is data that specifies the number of words of the following write data. The length data LG3: LG0 may be optional.

Upon detection of the first write command (OP7: OP0), the slave device 300 outputs the serial data input through the SSDI pin from the SSDO pin and generates the serial data in the SDO line. In this example, the same serial data as in the SDI line is generated in the SDO line with a delay of one word.

In the master device 200, the data (including the address and the length data) returned from the slave device 300 is compared with each data (including the address and the length data) transmitted by the master device 200, i.e., an expected value. If they match, the master device 200 issues a transfer command (CM7: CM0). The slave device 300, which receives the transfer command, transmits the write data (WD17: WD10, WD27: WD20, . . . , WD87: WD80) stored in the transfer buffer 312 to the address (AD23-AD0) specified by the register 304.

In FIG. 4, a case where the data match is illustrated, but when a mismatch is detected, the master device 200 does not issue a transfer command but again generates the serial data including the original first write command, and the address, the length data, and the write data following the original first write command.

The operation of the transmission system 100 has been described above. Next, advantages thereof will be described.

The master device 200 can receive readback of the data being written before the writing of all the data to the slave device 300 is completed, and thus determine whether the data match or mismatch during writing. Accordingly, it is possible to shorten the time required for the readback.

In addition, since the data in the register 304 is updated only when the transfer command is issued based on the match determination, it is guaranteed that the data in the register 304 is correct. Thus, it is possible to prevent malfunction of the internal circuit 302 and enhance the reliability.

The slave device 300 outputs all the data (including the addresses and the length data) except the command among the serial data received from the master device 200, through the SSDO pin. Therefore, since not only an error in the write data but also an address error or the like can be detected, it is possible to further enhance the reliability. This advantage will be described in detail.

Although the write data WD is correctly transmitted, the address AD may be incorrectly transmitted. In this case, in the conventional readback illustrated in FIG. 2A and FIG. 2B, the data is once written to the incorrect address AD of the register, and thus the data is damaged. An error is detected by the readback. Then, the writing is retried. The second time, it is assumed that the correct data is written to the correct address. At this time, the damaged data of the original incorrect address AD cannot be restored.

According to the transmission system 100 of the present embodiment, since the transfer command can be generated to rewrite the register 304 only when the data and the address are correct, it is possible to resolve even such a problem.

In addition, in the master device 200, since a comparison is made for the data transmitted by the master device 200 in the order of transmission of word by word (or bit by bit) without specially distinguishing which type (the write data, the address, or the length data) it is, it is rather possible to simplify the configuration.

Figure 5:
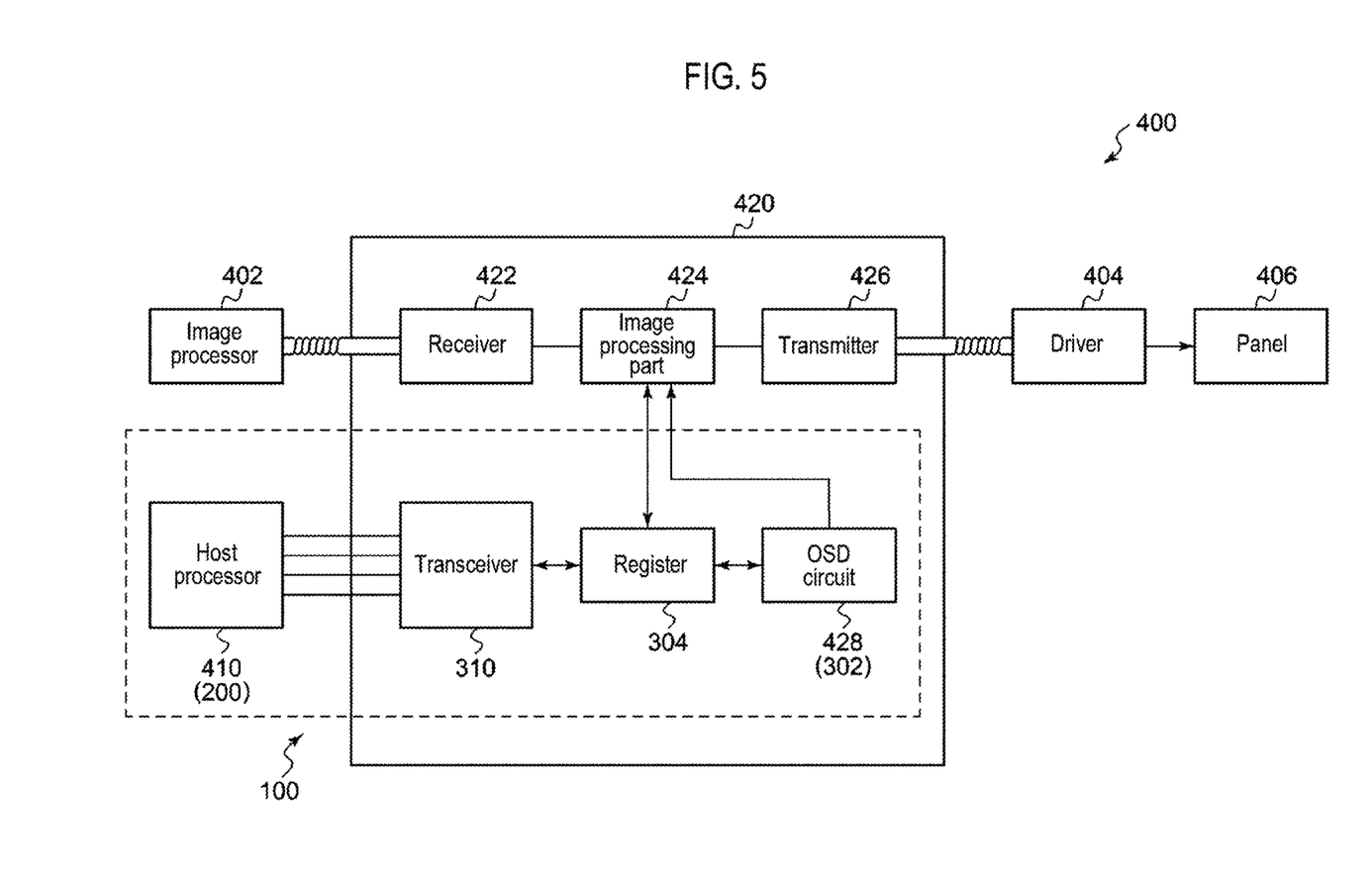
FIG. 5 is a block diagram of a display system using the transmission system in FIG. 3.

Next, applications of the transmission system 100 will be described. FIG. 5 is a block diagram of a display system 400 using the transmission system 100 in FIG. 3. The display system 400 includes an image processor 402, a host processor 410, a timing controller 420, a display driver 404, and a display panel 406.

The display panel 406 is a liquid crystal panel or an organic EL panel. The image processor 402 generates image data to be displayed on the display panel 406. The timing controller 420 includes a receiver (main interface circuit) 422 that receives the image data, an image processing part 424 that performs predetermined signal processing on the received image data, and a transmitter 426 that outputs the image data after the signal processing and a control signal accompanying the image data to the display driver 404.

The display driver 404 includes a source driver and a gate driver, which drive the host processor 410 based on a signal supplied from the display driver 404.

The display system 400 has an OSD function. The timing controller 420 includes an OSD circuit 428, which superimposes a character, based on control data from the host processor 410, on the image data.

The architecture of the transmission system 100 described above may be used for transmission of the control data from the host processor 410 to the timing controller 420. That is, the host processor 410 has the same serial interface as that of the master device 200 described above, and the timing controller 420 has the same serial interface (the transceiver circuit 310 and the register 304) as that of the slave device 300 described above. The OSD circuit 428 corresponds to the internal circuit 302 in FIG. 3. The control data from the host processor 410 may include operation parameters of the image processing part 424. In this case, the image processing part 424 also corresponds to the internal circuit 302.

In recent years, the liquid crystal work of cluster panels of vehicles has become advanced. Furthermore, an electronic door mirror equipped with a camera and a monitor, instead of a rearview mirror or a side mirror, has become a reality according to the lifting of the ban on mirrorless vehicles. In addition, the vehicles are equipped with a car navigation system, and the like.

Figure 6:
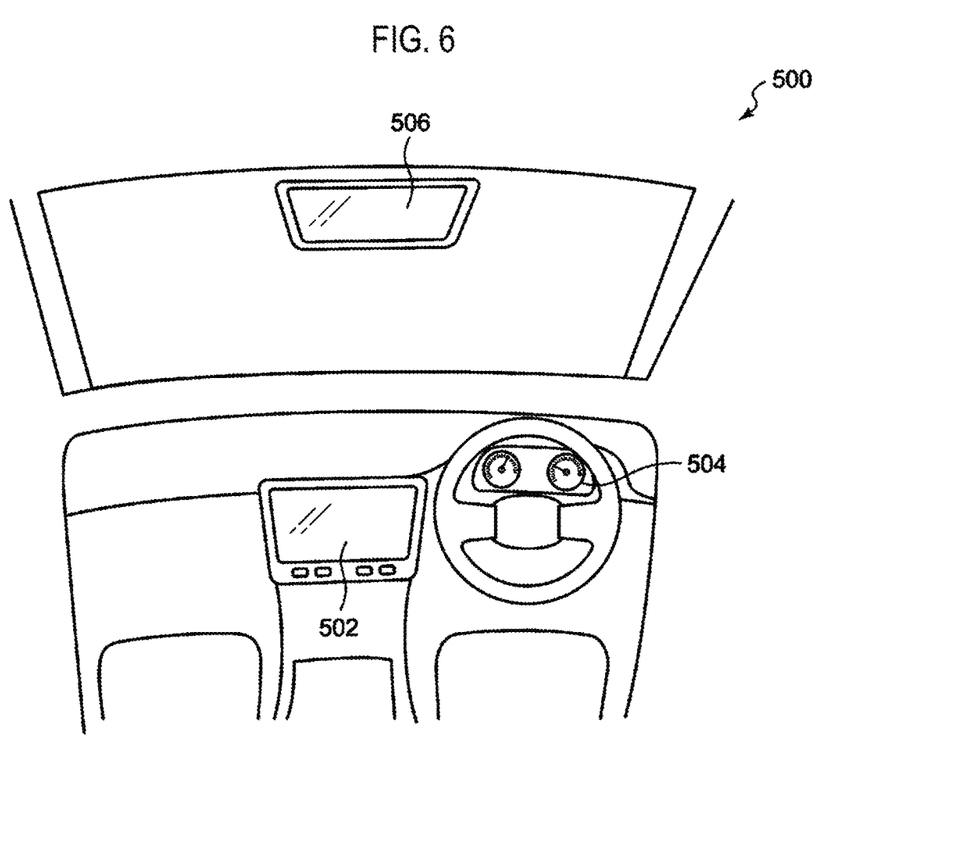
FIG. 6 is a diagram illustrating a cockpit of a vehicle equipped with a display system.

High reliability is required for vehicles, and high reliability is also required for display systems used therein. Therefore, the display system 400 in FIG. 5 is useful for in-vehicle applications. FIG. 6 is a diagram illustrating a cockpit of a vehicle 500 equipped with a display system 400. For example, the display system 400 may be suitably used for a display part 502 of a car navigation system. Alternatively, the display system 400 may be suitably used for a display part 504 of a cluster panel. Alternatively, the display system 400 may be suitably used for a display part 506 of an electronic door mirror.

The application of the transmission system 100 is not limited to vehicles, but it may also be applied to applications requiring high reliability, such as industrial machines or the like, or to electronic devices (consumer devices) such as laptop computers, smart phones, tablet PCs, digital cameras, or the like.

The present disclosure has been described above based on the embodiments. It is to be understood by those skilled in the art that the embodiments are merely illustrative and may be differently modified by any combination of the components or processes thereof, and the modifications are also within the scope of the present disclosure. Hereinafter, these modifications will be described.

First Modification

The transceiver circuit 210 and the transceiver circuit 310 may support a second write command in addition to the first write command. The second write command is similar to the conventional one. That is, when the second write command is included at the beginning of the serial data input through the SSDI pin, the transceiver circuit 310 directly writes the data WD input through the SSDI pin to the register 304 without passing through the transfer buffer 312 (direct mode).

By supporting the second write command (direct mode), the semiconductor devices (200 and 300) may also be used for platforms that may use the conventional readback method, thereby improving the versatility.

Second Modification

In the embodiment, the slave device 300 outputs all the data (including the address and the length data) except the command among the serial data received from the master device 200, through the SSDO pin, but it is not limited thereto. For example, the slave device 300 may output only part of the received serial data (for example, part of the write data WD) through the SSDO pin.

According to the present disclosure in some embodiments, it is possible to shorten a readback time and/or enhance reliability of a semiconductor device.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device for writing data to a slave device, comprising:
    a data output pin connected to a data input pin of the slave device;
    a data input pin connected to a data output pin of the slave device; and
    a transceiver circuit configured to:
        output a write command, and an address and first write data following the write command through the data output pin while receiving second write data output from the slave device through the data input pin; and
        output a transfer command through the data output pin when the second write data matches the first write data.

2. The device of claim 1, wherein the transceiver circuit includes:
    a first memory configured to store the first write data;
    a second memory configured to store the second write data; and
    a determination circuit configured to determine whether or not the first write data matches the second write data corresponding to the first write data.

3. An electronic device, comprising:
    a first semiconductor device, including:
        a first data input pin;
        a first data output pin;
        an internal circuit;
        a register accessible by the internal circuit; and
        a first transceiver circuit including a transfer buffer and configured to:
            write data input through the first data input pin to the transfer buffer, and output the data through the first data output pin; and
            transfer data stored in the transfer buffer to the register when a transfer command is input through the first data input pin; and
    a second semiconductor device for writing data to the first semiconductor device, including:
        a second data output pin connected to the first data input pin of the first semiconductor device;
        a second data input pin connected to the first data output pin of the first semiconductor device; and
        a second transceiver circuit configured to:
            output a write command, and an address and first write data following the write command through the second data output pin while receiving second write data output from the first semiconductor device through the second data input pin; and
output the transfer command through the second data output pin when the second write data matches the first write data.

4. A data transmission method, comprising:
transmitting, by a master device, a write command, an address, and write data to a slave device;
storing, by the slave device, the write data in a transfer buffer and returning the write data to the master device;
determining, by the master device, whether or not the write data, transmitted to the slave device by the master device, matches the write data returned from the slave device;
transmitting, by the master device, a transfer command upon determining that the write data transmitted to the slave device matches the write data returned from the slave device; and
transferring, by the slave device, the write data stored in the transfer buffer to a register in response to the transfer command.

5. A timing controller, comprising:
a main interface configured to receive image data;
an image processing part configured to process the image data;
a transmitter configured to output the processed image data; and
an on-screen display (OSD) circuit configured to superimpose a character on the image data based on control data,
wherein the OSD circuit includes:
 a data input pin;
 a data output pin;
 a register;
 an interface circuit including a transfer buffer and configured to:
  write data input through the data input pin to the transfer buffer, and output the data through the data output pin; and
  transfer data stored in the transfer buffer to the register when a transfer command is input through the data input pin; and
 a decoder configured to superimpose the character on the image data based on the data stored in the register.

6. A vehicle comprising the timing controller of claim 5.

* * * * *